(12) United States Patent
Nguyen et al.

(10) Patent No.: US 12,537,493 B2
(45) Date of Patent: Jan. 27, 2026

(54) INDEPENDENT CONTROL LOOPS TO MINIMIZE POSITIVE AND NEGATIVE MISMATCH IN DIFFERENTIAL AMPLIFIERS

(71) Applicant: MACOM Technology Solutions Holdings, Inc., Lowell, MA (US)

(72) Inventors: Duy Nguyen, Lowell, MA (US); William Allen, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 18/227,420

(22) Filed: Jul. 28, 2023

(65) Prior Publication Data

US 2025/0038719 A1    Jan. 30, 2025

(51) Int. Cl.
*H03F 3/45*        (2006.01)

(52) U.S. Cl.
CPC ............ *H03F 3/45748* (2013.01); *H03F 2203/45006* (2013.01); *H03F 2203/45401* (2013.01); *H03F 2203/45442* (2013.01)

(58) Field of Classification Search
CPC ....... H03F 3/45748; H03F 2203/45006; H03F 2203/45401
USPC .................................................. 330/9, 253
See application file for complete search history.

(56) References Cited

U.S. PATENT DOCUMENTS

| | | | |
|---|---|---|---|
| 4,350,974 A * | 9/1982 | Gordon | H03M 1/46 341/138 |
| 7,126,419 B2 * | 10/2006 | Miyasita | H03F 3/45475 330/69 |
| 7,855,576 B1 | 12/2010 | Luo | |
| 10,121,882 B1 | 11/2018 | Ho | |
| 10,681,802 B1 | 6/2020 | Beukema | |
| 2002/0101270 A1 * | 8/2002 | Nishizono | H04B 10/6931 327/205 |
| 2015/0180431 A1 * | 6/2015 | Abe | H03F 3/45071 330/259 |
| 2020/0393706 A1 * | 12/2020 | Vera Villarroel | H03F 3/45973 |
| 2021/0313970 A1 | 10/2021 | Chen | |
| 2021/0359655 A1 * | 11/2021 | Jo | H03G 1/0023 |

* cited by examiner

*Primary Examiner* — Andrea Lindgren Baltzell
(74) *Attorney, Agent, or Firm* — Sheridan Ross P.C.

(57) ABSTRACT

Independent control loops for mitigating positive and negative mismatch in differential amplifiers are provided. A method includes comparing a first voltage measured at a positive side output of an emitter follower with a reference voltage, resulting in a first voltage difference. The method also includes comparing a second voltage measured at a negative-side output of the emitter follower with the reference voltage, resulting in a second voltage difference. In addition, the method includes independently controlling the positive side and the negative side of the differential amplifier based on the first voltage difference and the second voltage difference.

19 Claims, 8 Drawing Sheets

INDEPENDENT CONTROL LOOPS TO MINIMIZE POSITIVE AND NEGATIVE MISMATCH IN DIFFERENTIAL AMPLIFIERS

TECHNICAL FIELD

The subject disclosure relates generally to electrical circuit design and, in particular, to differential amplifier circuits, apparatuses, and methods related thereto.

BACKGROUND

The conventional design of differential amplifier circuits results in a large mismatch between a positive side and a negative side (P/N mismatch) in the differential amplifier. The P/N mismatch degrades the performance of the differential amplifier. Further, the P/N mismatch can cause various issues when the differential amplifier is used to drive an optical modulator. Accordingly, unique challenges exist related to differential amplifier design.

It is noted that the above-described description is merely intended to provide a contextual overview of circuit design and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

An embodiment relates to a method for correcting a positive side-negative side mismatch of a differential amplifier. The method includes determining a first direct current (DC) voltage at a positive side output of an emitter follower of the differential amplifier, resulting in a first output voltage. The method also includes comparing the first output voltage with a reference voltage. Further, the method includes, based on a first result of the comparing, controlling a first DC current flowing through the positive side of a PFET and a load of a VGA stage of the differential amplifier.

The method can also include determining a second direct current (DC) voltage at a negative side output of the emitter follower of the differential amplifier, resulting in a second output voltage. Also, the method can include comparing the second output voltage with the reference voltage. Based on a second result of the comparison, the method can include controlling a second DC current flowing through a negative side of the PFET and the load of the VGA stage of the differential amplifier.

The positive side and the negative side are controlled independently via two substantially identical circuit loops. The positive side and the negative side are kept the same (or as equal as possible) when a mismatch occurs.

Comparing the first output voltage with the reference voltage can include using an operational amplifier to perform the comparison. For example, controlling the first DC current can include driving a gate of the positive side of the PFET via an output of the operational amplifier.

In another example, controlling the first DC current can include automatically adjusting an output DC voltage of the VGA stage. The automatic adjustment can include retaining the output DC voltage of the emitter follower at a constant value. The constant value is substantially the same as the reference voltage. Further, retaining the constant value is over at least one of a temperature, a gain control setting, and a process variation.

Another embodiment relates to a method for mitigating positive side-negative side mismatch in a differential amplifier. The method includes comparing a first voltage measured at a positive side output of an emitter follower with a reference voltage, resulting in a first voltage difference. The method also includes comparing a second voltage measured at a negative-side output of the emitter follower with the reference voltage, resulting in a second voltage difference. In addition, the method includes independently controlling the positive side and the negative side of the differential amplifier based on the first voltage difference and the second voltage difference.

To perform the independent control, the method includes using a first control loop for controlling the positive side and using a second control loop for controlling the negative side. The first control loop and the second control loop are independent of one another.

The independent control of the positive and negative side can include maintaining an output DC voltage of the emitter follower at a constant value. The constant value is substantially the same as the reference voltage. Retaining the constant value is over one or more of a temperature, a gain control setting, and a process variation.

A further embodiment relates to a circuit for mitigating positive side-negative side mismatches in a differential amplifier. The circuit can include a positive side transistor operatively connected to an input of a first control loop and a negative side transistor operatively connected to an input of a second control loop. An output of the first control loop is operatively connected to an input node of the positive side and an output of the second control loop is operatively connected to an input node of the negative side. A first operation of the first control loop operates independent of a second operation of the second control loop.

The circuit can also include a first resistor connected between an input voltage source and the positive side transistor and a second resistor connected between the input voltage source and the negative side transistor. The first resistor is configured for control of an input voltage at the positive side and the second resistor is configured for control of the input voltage at the negative side.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As discussed above, a problem associated with conventional designs of differential amplifiers is that there is a large mismatch between the positive side and the negative side (P/N mismatch). The P/N mismatch can degrade the amplifier performance and can also cause issues when the amplifier is used to drive an optical modulator.

Generally, the P/N mismatch should be smaller than a certain value (e.g., a defined value). Some wafers have high yield loss due to this mismatch issue, which have been observed in various use cases. Further, this issue has been observed in multiple drivers and transimpedance amplifiers (TIAs), including, but not limited to, general band limited amplifiers, wideband optical drivers, and wideband TIAs.

Figure 1:
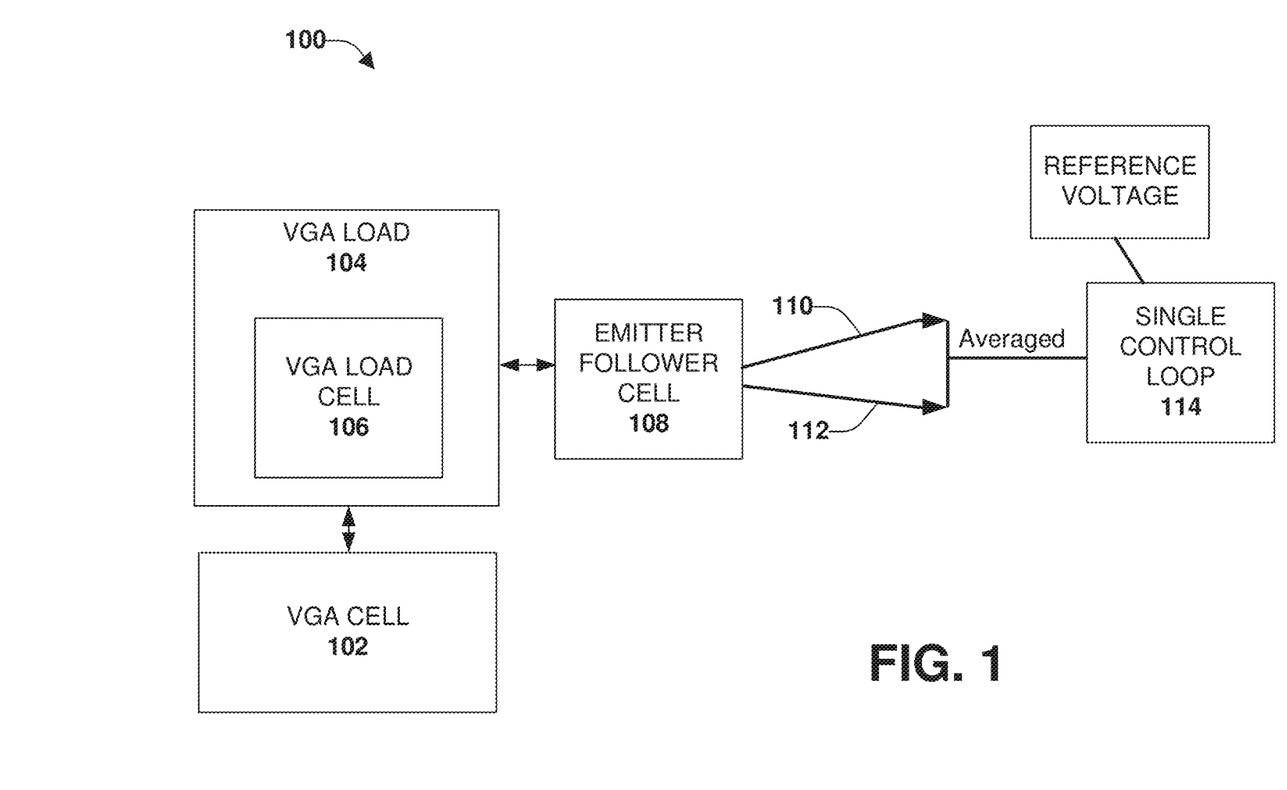
FIG. 1 illustrates an example, non-limiting, schematic representation of a conventional amplifier circuit.

It is noted that the conventional designs only control the average DC voltage of the positive side (P side) and the negative side (N side). For example, FIG. 1 illustrates an example, non-limiting, schematic representation of a conventional amplifier circuit 100. Illustrated are a variable gain amplifier (VGA) cell 102 and a VGA load 104, which includes a VGA load cell 106.

Also illustrated in FIG. 1 is an emitter follower cell 108. There are two outputs of the emitter follower cell, illustrated as a first output 110 and a second output 112. For example, the first output 110 can be for the P side and the second output 112 can be for the N side, or vice versa (e.g., the first output 110 is for the N side and the second output 112 is for the P side). Respective values of the two outputs are averaged and processed through a single control loop 114. Therefore, there is only control of the average voltage. The design of FIG. 1 has no ability to correct the P/N mismatch. In some cases, controlling the average DC voltage of the P side and the N side could even make the mismatch worse.

Figure 2:
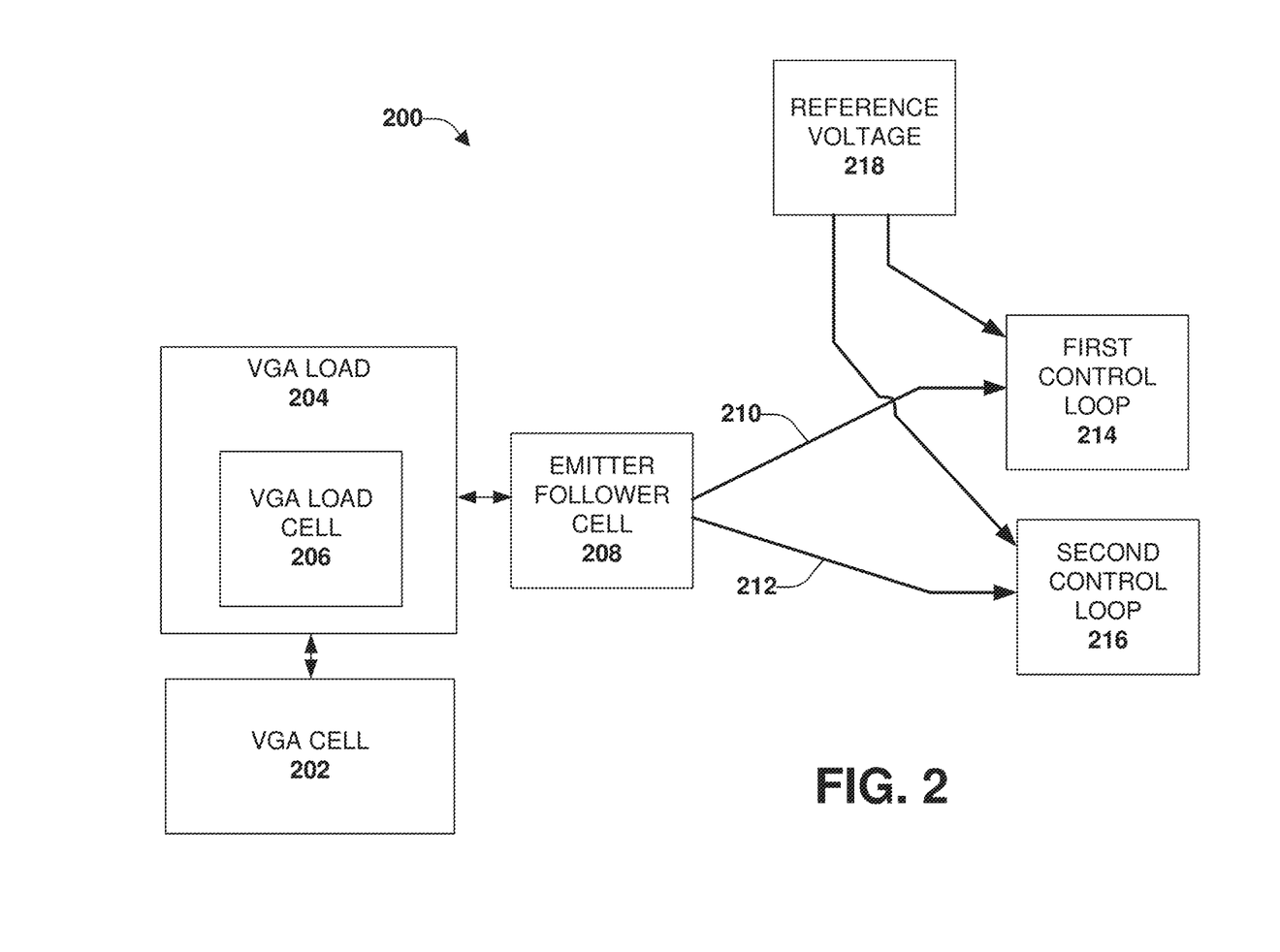
FIG. 2 illustrates an example, non-limiting, schematic representation of a circuit that includes independent control loops for mitigating positive and negative mismatch in differential amplifiers in accordance with one or more embodiments described herein.

To overcome the above as well as other issues, FIG. 2 illustrates an example, non-limiting, schematic representation of a circuit 200 that includes independent control loops for mitigating positive and negative mismatch in differential amplifiers in accordance with one or more embodiments described herein. Repetitive description of like elements employed in other embodiments described herein is omitted for sake of brevity.

The circuit 200 includes a VGA cell 202 and a VGA load 204, which includes a VGA load cell 206. The VGA load cell 206 includes two additional resistors, as compared to the conventional amplifier circuit 100 of FIG. 1. One resistor is associated with the P side and another resistor is associated with the N side. The resistors cause a VCC connection to be removed from direct input to the P side and N side (e.g., has to go through the additional resistors). Further details related to these resistors and their functionality will be provided below with respect to FIG. 4.

The circuit 200 also includes an emitter follower cell 208 that has two outputs, illustrated as a first output 210 and a second output 212. For example, the first output 210 can be for the P side and the second output 212 can be for the N side, or vice versa (e.g., the first output 210 is for the N side and the second output 212 is for the P side). For the circuit 200 of FIG. 2, the first output 210 is processed through a first control loop 214 and the second output 212 is processed through a second control loop 216. The first control loop 214 and the second control loop 216 are independent of one another. Further details related to these controls and their functionality will be provided below with respect to FIGS. 3 and 4.

A value of one or more capacitors of the first control loop 214 and the second control loop 216 of the circuit 200 can be increased, as compared to the conventional amplifier circuit 100 of FIG. 1. Further, a reference voltage 218 (e.g., a value of a reference voltage) is also associated with the circuit 200.

Figure 3:
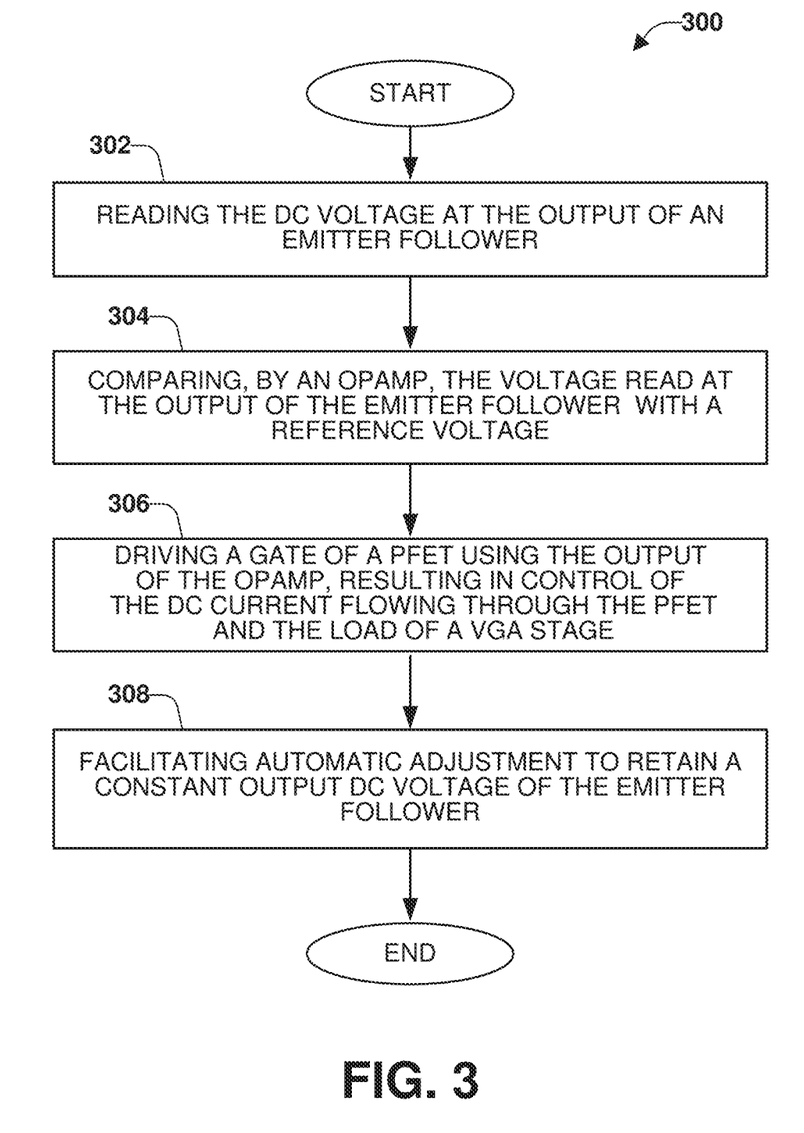
FIG. 3 illustrates an example, non-limiting, flow diagram of a method that facilitates correction of the positive and/or negative mismatch in accordance with one or more embodiments described herein.

In further detail, FIG. 3 illustrates an example, non-limiting, flow diagram of a method 300 that facilitates correction of the P/N mismatch in accordance with one or more embodiments described herein. Repetitive description of like elements employed in other embodiments described herein is omitted for sake of brevity.

As discussed, the conventional design (e.g., the conventional amplifier circuit 100 of FIG. 1) incorporates only one control loop to control the average output DC voltage of the P side and N side of a differential amplifier. The disclosed embodiments employ two independent control loops to control the P side and the N side output DC voltage independently.

The method 300 starts are 302 when the loop (e.g., the first control loop 214, the second control loop 216) determines the DC voltage at the output (e.g., the first output 210, the second output 212) of an emitter follower (e.g., the emitter follower cell 208). For example, the output can be determined based on measuring and/or reading the respective output.

The voltage determined at the output of the emitter follower is compared, at 304, with a reference voltage (e.g., the reference voltage 220). In an example, the comparison can be performed using a low speed operational amplifier (op amp). At 306, the output of the op amp drives the gate of a PFET, resulting in control of the DC current flowing through the PFET and the load of a VGA stage. By changing this current, the output DC voltage of the VGA stage (also the input DC voltage of emitter follower stage) is automatically adjusted to keep the output DC voltage of the emitter follower constant (e.g., at a constant value), or as constant as possible. In an example, the constant value is equal to, similar to, or substantially the same as the reference voltage. The output DC voltage is kept constant (e.g., at the constant value) over temperature, over gain control setting, and/or over process variations.

Further, as discussed with respect to the circuit 200 of FIG. 2, the P side and the N side are controlled independently using two identical loops. Therefore, the output DC voltage of the P side and the N side can be retained at the same (e.g., substantially the same, nearly equal, or similar) values when a mismatch occurs.

Figure 4:
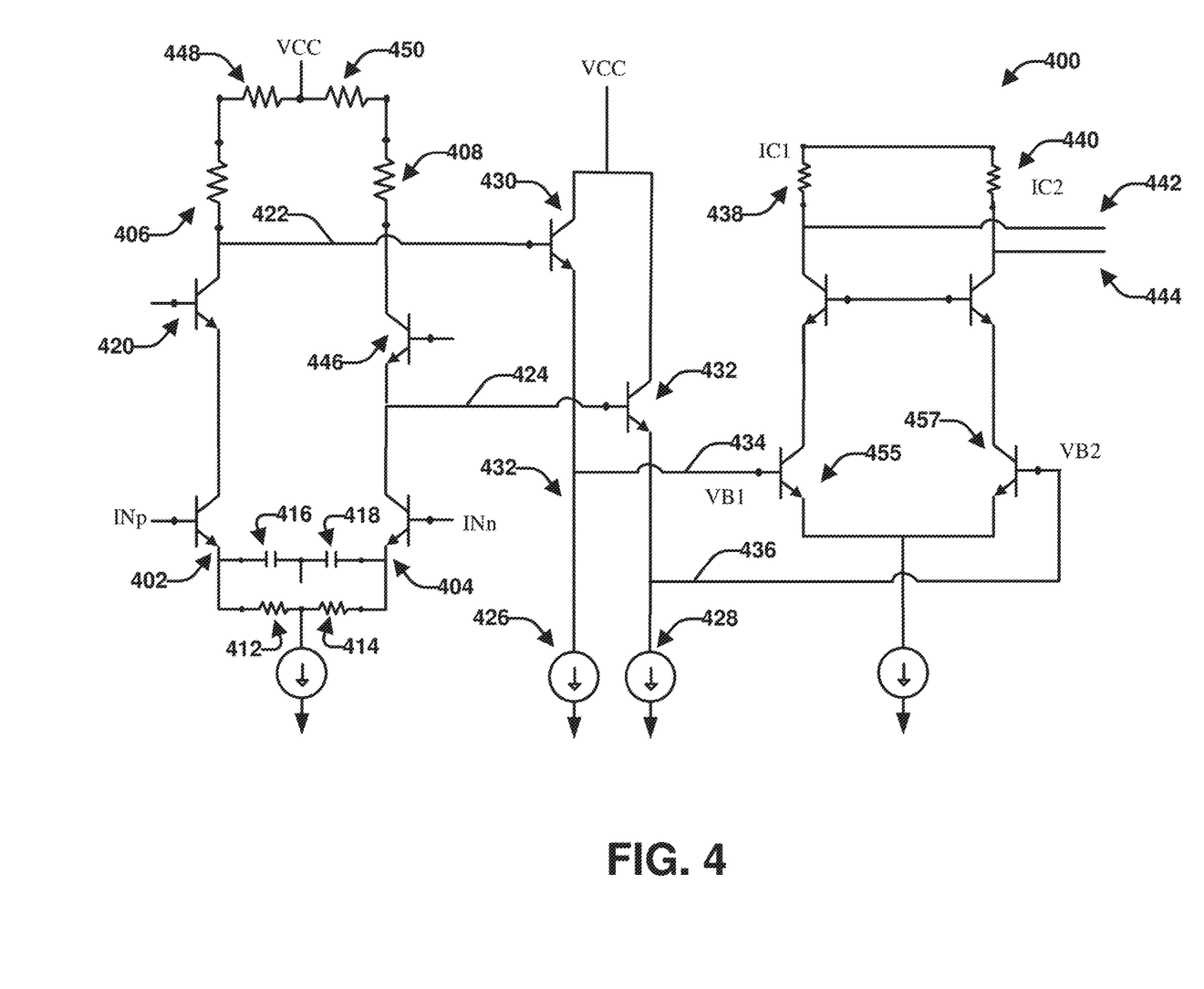
FIG. 4 illustrates an example, non-limiting, circuit for mitigating positive side-negative side mismatch in a differential amplifier in accordance with one or more embodiments described herein.

FIG. 4 illustrates an example, non-limiting, circuit 400 for mitigating positive side-negative side mismatch in a differential amplifier in accordance with one or more embodiments described herein. Repetitive description of like elements employed in other embodiments described herein is omitted for sake of brevity. The circuit 400 can comprise one or more of the components and/or functionality of the circuit 200, and vice versa. Further, the circuit 400 can implement the method 300 of FIG. 3 and/or other methods discussed herein.

The circuit 400 includes a first transistor 402 and a second transistor 404. In this example, the first transistor 402 is a positive transistor and the second transistor 404 is a negative transistor. Thus, the input at the first transistor 402 is identified as a positive input (INp) and the input at the second transistor 404 is identified as a negative input (INn). What is meant by positive and negative is due to the waveform of the input signal having a positive value and a negative value. It is noted that in some use cases, the first transistor 402 can be the negative transistor and the second transistor 404 can be the positive transistor. It is also noted that the circuit 400 is discussed with respect to having two stages. However, the disclosed embodiments are not so limited and various use cases can have three-stages, four-stages, five-stages, and so on.

The resistors 406 and 408 are the load of the differential amplifier. Further, VCC represents the current bias 410 (e.g., a current mirror). The circuit also includes resistors 412, 414, and associated capacitors 416, 418. There is also a transistor 420 that can operate as a cascode transistor.

Connections to the second stage are illustrated by lines 422 and 424. The emitter follower includes a first current mirror 426 and a second current mirror 428. The voltage at the transistors 430 and 432 is lower than the input voltage VCC. This lower voltage goes to the output stage, as indicated by lines 434 and 436. As indicated, there is a load, represented by resistors 438 and 440. The output signals are represented by lines 442 and 444.

A differential 446 is also included in the circuit. Further, an additional first resistor 448 is added between the VCC and the resistor 406. An additional second resistor 450 is added between the VCC and the differential 446. The additional resistors (e.g., the additional first resistor 448, the additional second resistor 450) provide for mismatches between the sides as it relates to temperature, gain control settings, and/or process variations.

It is also noted that the low frequency cut-off of the amplifier is another factor considered. According to the disclosed embodiments, the low frequency cut-off specification is, for example, 1.5 Megahertz (MHz). Using the two loops instead of one loop and adding the resistors can impact the low frequency cut-off. The parasitics of the PFET also plays a role. Therefore, the bypass capacitors at the PFET gate must be increased to achieve the required low frequency cut-off. Overall, the PFET size, the bypass capacitors, and the resistors are all optimized together to meet the design specifications. In this regard for the avoidance of doubt, any embodiments described herein in the context of optimizing or optimization are not so limited and should be considered also to cover any techniques that implement underlying aspects or parts of the described aspects to mitigate and/or reduce mismatch, even if resulting in a sub-optimal variant obtained by relaxing aspects or parts of a given implementation or embodiment.

Figure 5:
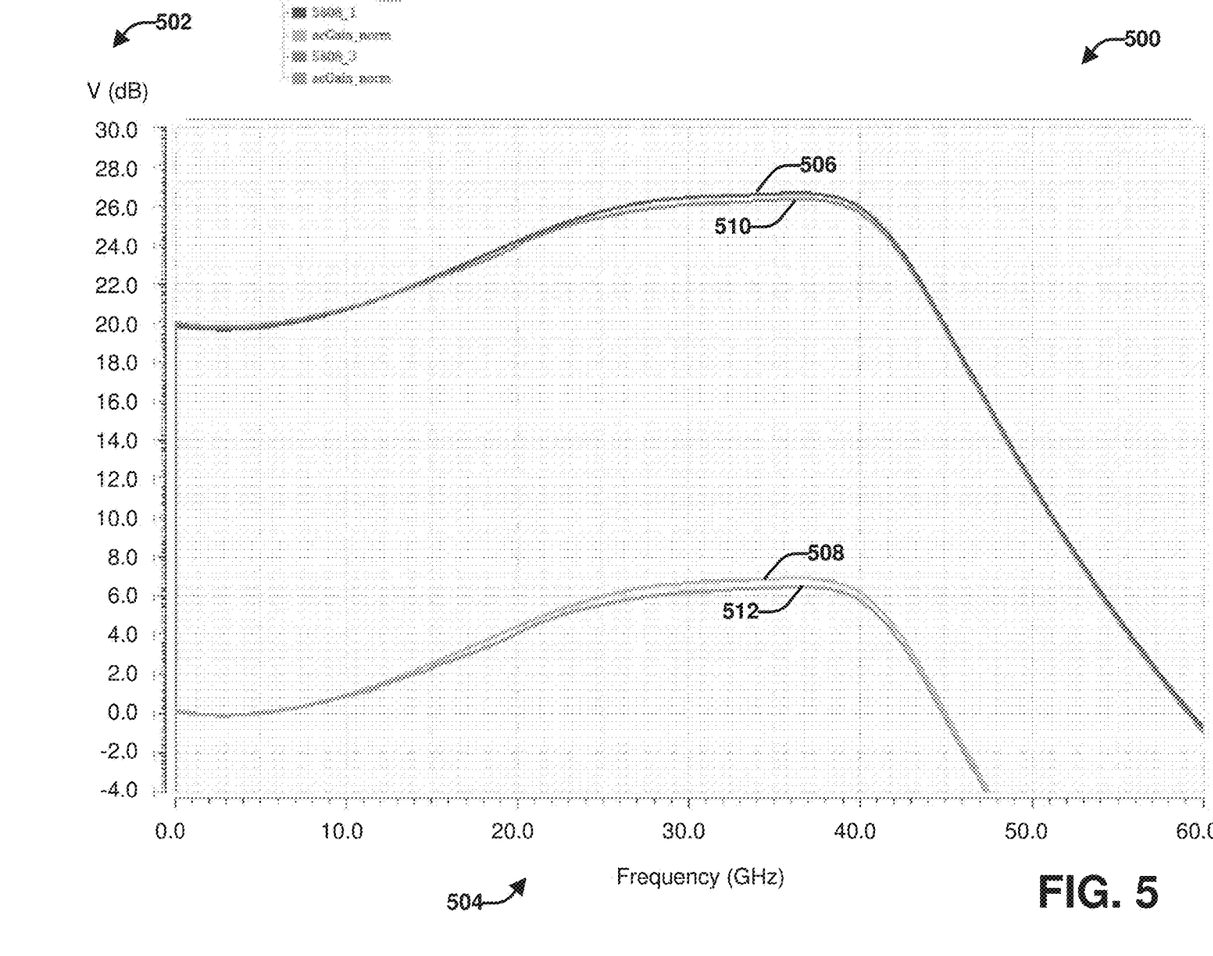
FIG. 5 illustrates an example, non-limiting, chart showing the frequency response comparison between a conventional design and a design according to the disclosed embodiments.

FIG. 5 illustrates an example, non-limiting, chart 500 showing the frequency response comparison between a conventional design and a design according to the disclosed embodiments. Illustrated on the vertical axis 502 is voltage decibel (dB) and on the horizontal axis 504 is frequency in gigahertz (GHz). The chart 500 is based on maximum gain and a temperature of 60 degrees Celsius. Lines 506 and 508 are for the conventional design. Lines 510 and 512 (acGain_Norm) are for the embodiment provided herein.

Figure 6:
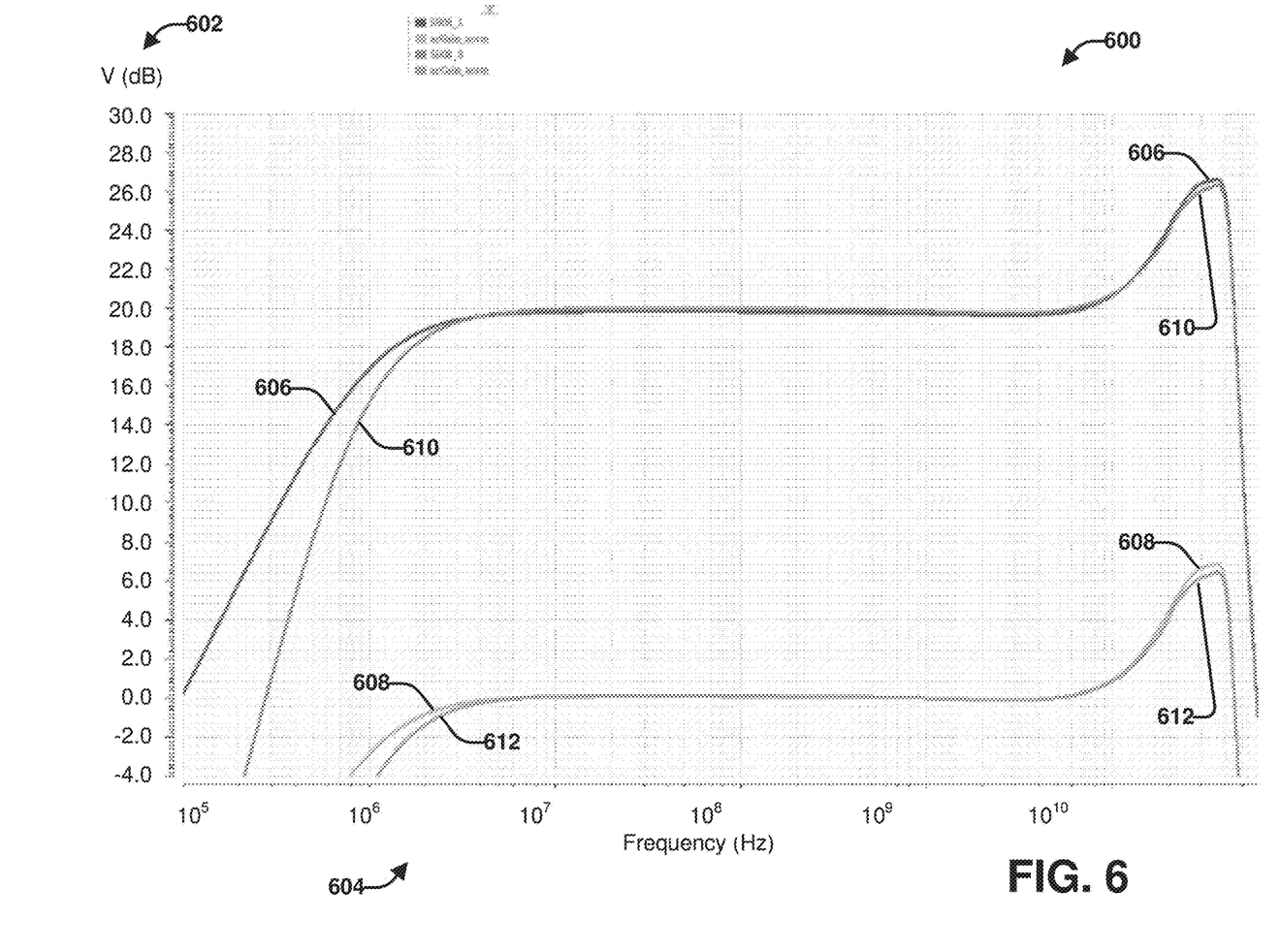
FIG. 6 illustrates an example, non-limiting, chart showing the maximum gain comparison between a conventional design and a design according to the disclosed embodiments.

FIG. 6 illustrates an example, non-limiting, chart 600 showing the maximum gain comparison between a conventional design and a design according to the disclosed embodiments. Illustrated on the vertical axis 602 is voltage decibel (dB) and on the horizontal axis 604 is frequency in Hertz (Hz) The chart 600 is based on maximum gain, a temperature of 60 degrees Celsius, and a log scale. Lines 606 and 608 are for the conventional design. Lines 610 and 612 (acGain_Norm) are for the embodiment provided herein.

As depicted in FIG. 5 and FIG. 6, the gain, high frequency bandwidth, peaking, low frequency cut-off of the disclosed embodiments are almost the same as those of the conventional design. Additionally, the disclosed circuit design has no negative impact on the nominal performance as compared to the conventional design.

Various simulations were performed to test the functionality of the circuit (e.g., the circuit 200 of FIG. 2). Specifically, two DC simulations were performed, one with an ideal condition (no mismatch) and the other with the mismatch added. For some simulations, a mismatch was added to the VGA load. For example, a resistor or other impedance device was placed in the P-side circuit such that the P side has a 7 ohm higher resistance than the N side. This represents a 10% mismatch in the resistor that could happen in practice due to process variations and random mismatch.

For the conventional design, the DC simulation with no mismatch (ideal condition), the measured P side voltage output was 1.442 V and the measured N-side voltage output was 1.442 V. In the case of the "artificial" mismatch, as discussed above, the measured P side voltage output was 1.493 V and the measured N-side voltage output was 1.389 V. Thus, the conventional design had a large difference between P and N output DC voltage when mismatch was present.

For the circuit design discussed herein, the DC simulation with no mismatch (ideal condition), the measured P side voltage output was 1.44 V and the measured N-side voltage output was 1.44 V. In the case of the "artificial" mismatch, as discussed above, the measured P side voltage output was 1.459 V and the measured N-side voltage output was 1.438 V. Thus, the design provided herein showed very little difference between P and N in the mismatch condition.

Figure 7:
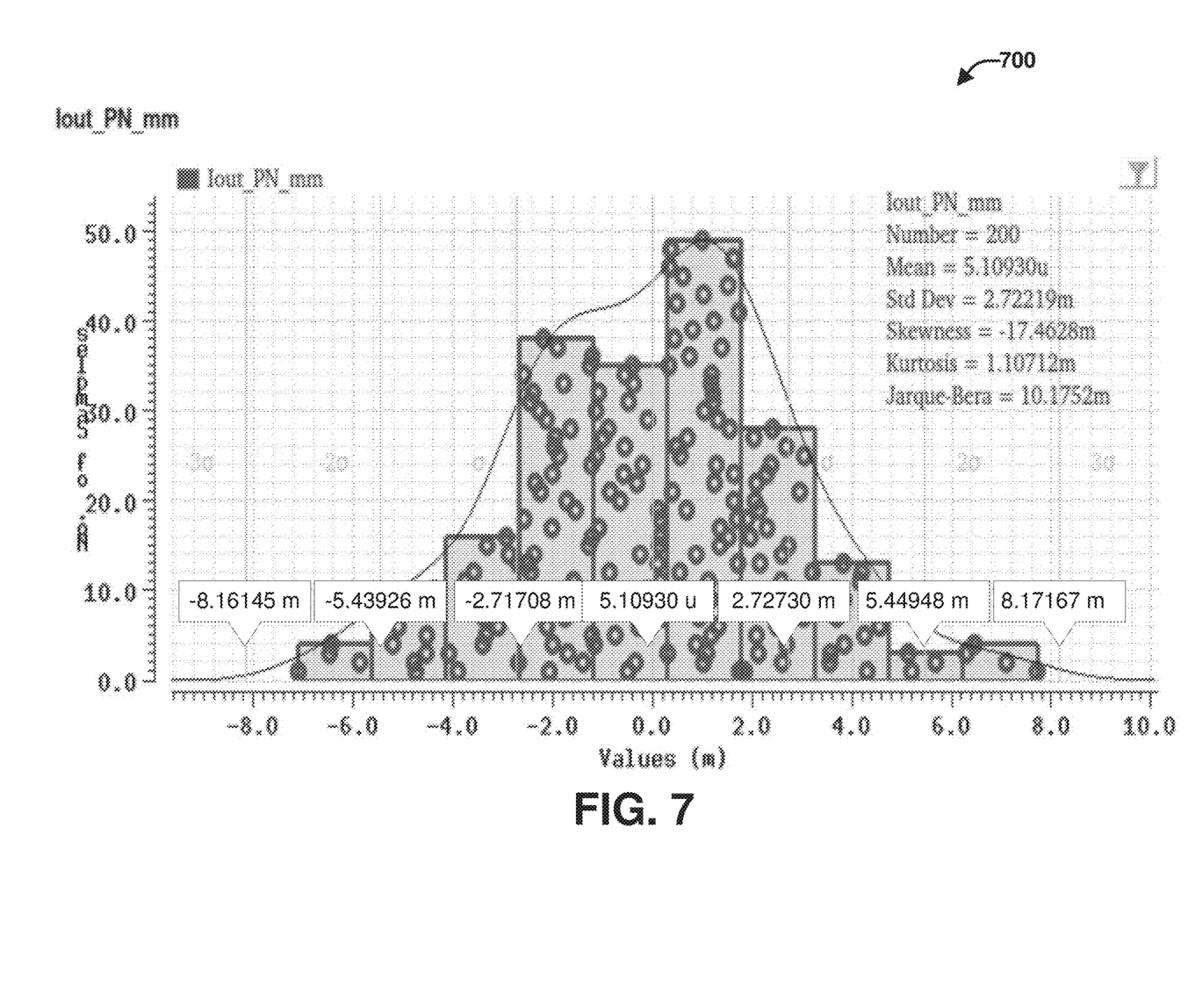
FIG. 7 illustrates an example, non-limiting, chart of results of a simulation for the conventional design.
Figure 8:
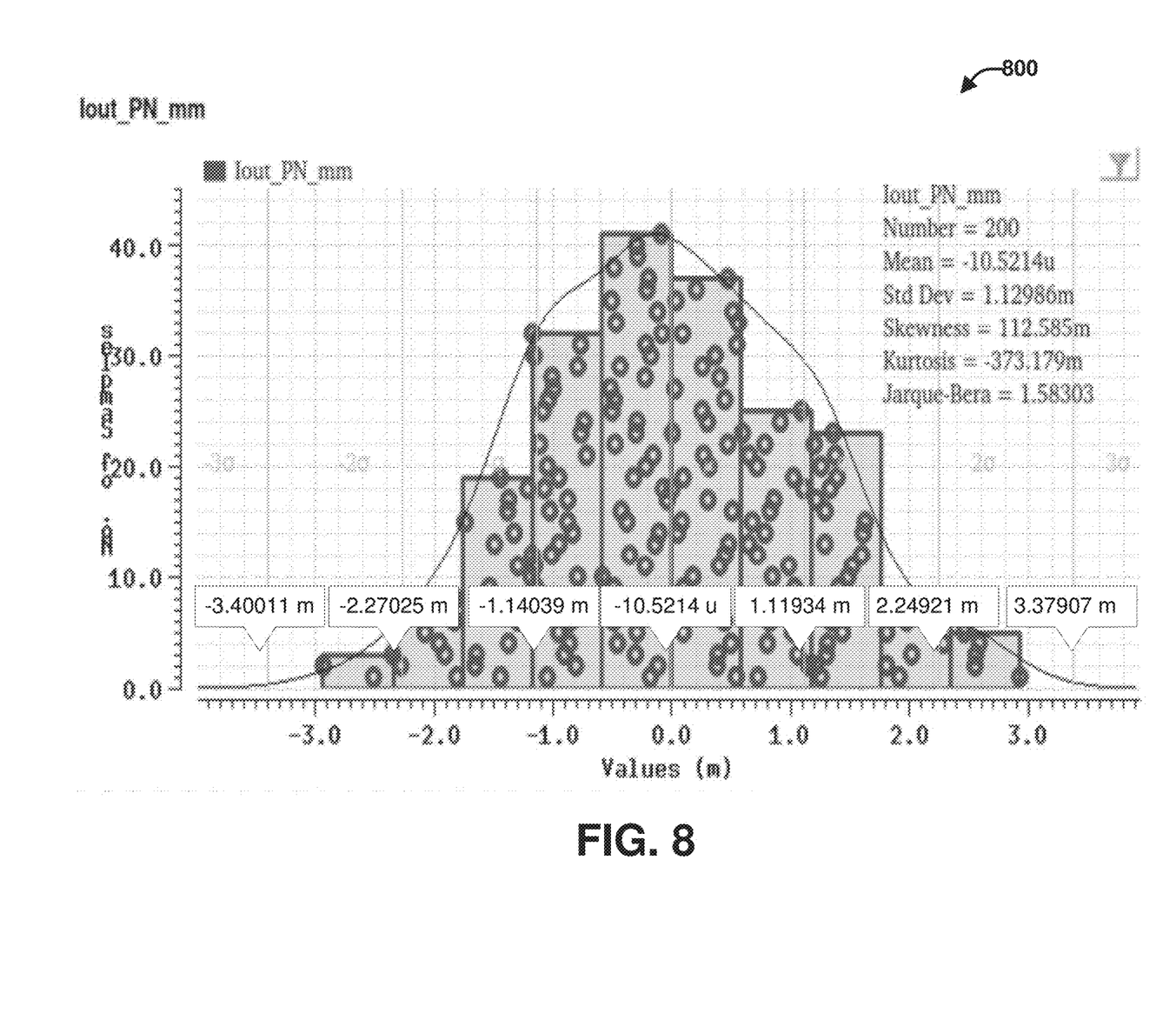
FIG. 8 illustrates an example, non-limiting, chart of results of a simulation for the design provided herein.

FIG. 7 illustrates an example, non-limiting, chart 700 of results of a simulation for the conventional design. FIG. 8 illustrates an example, non-limiting, chart 800 of results of a simulation for the design provided herein. The simulation utilized to produce the chart 700 and the chart 800 is a Monte-Carlo simulation to analyze the P DC current and/or the N DC current.

The Monte Carlo simulates the entire amplifier where mismatches could happen randomly anywhere. The simulation result is the P and N current mismatch at the output of the entire amplifier (this is the final specification by the end user).

In the conventional design (FIG. 7), the worst case P/N current mismatch could be from negative 8 milliamps (−8 mA) to positive 8 milliamps (+8 mA), where the nominal current is 25 mA for each side. In the case of FIG. 7, the standard deviation is 2.7 mA.

It is noted that the reason the mismatch is not reduced close to 0 mA is because the amplifier has other stages such as input stage, final output stage. As discussed herein, the design is employed in the VGA and emitter follower stage only for purposes of simplicity. However, the design could be expanded to apply to any stages in any designs. It is further noted that the circuit provided herein does not significantly increase the overall size (or footprint) of a device.

Methods that can be implemented in accordance with the disclosed subject matter will be better appreciated with reference to the above flow charts. While, for purposes of simplicity of explanation, the methods are shown and described as a series of acts or blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Other than in the operating examples, if any, or where otherwise indicated, all numbers, values and/or expressions referring to parameters, measurements, conditions, etc., used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for correcting a positive side-negative side mismatch of a differential amplifier, comprising:
   determining a first direct current (DC) voltage at a positive side output of an emitter follower of the differential amplifier, resulting in a first output voltage;
   comparing the first output voltage with a reference voltage;
   based on a first result of the comparing, controlling a first DC current flowing through a positive side of a PFET and a load of a VGA stage of the differential amplifier; and
   connecting a resistor between an input voltage source and the positive side of the PFET.

2. The method of claim 1, further comprising:
   determining a second direct current (DC) voltage at a negative side output of the emitter follower of the differential amplifier, resulting in a second output voltage;
   comparing the second output voltage with the reference voltage; and
   based on a second result of the comparing, controlling a second DC current flowing through a negative side of the PFET and the load of the VGA stage of the differential amplifier.

3. The method of claim 2, wherein the positive side and the negative side are controlled independently via two substantially identical circuit loops.

4. The method of claim 3, wherein the positive side and the negative side are kept the same when a mismatch occurs.

5. The method of claim 1, wherein the comparing the first output voltage with the reference voltage comprises using an operational amplifier to perform the comparing.

6. The method of claim 5, wherein the controlling the first DC current comprises:
   driving a gate of the positive side of the PFET via an output of the operational amplifier.

7. The method of claim 1, wherein the controlling the first DC current comprises:
   automatically adjusting an output DC voltage of the VGA stage.

8. The method of claim 7, wherein the automatically adjusting comprises: retaining the output DC voltage of the emitter follower at a constant value.

9. The method of claim 8, wherein the constant value is substantially the same as the reference voltage.

10. The method of claim 8, wherein the retaining the constant value is over at least one of a temperature, a gain control setting, and a process variation.

11. A method for mitigating positive side-negative side mismatch in a differential amplifier, comprising:
    comparing a first voltage measured at a positive side output of an emitter follower with a reference voltage, resulting in a first voltage difference;
    comparing a second voltage measured at a negative side output of the emitter follower with the reference voltage, resulting in a second voltage difference; and
    independently controlling the positive side and the negative side of the differential amplifier based on the first voltage difference and the second voltage difference.

12. The method of claim 11, wherein the independently controlling comprises:
    using a first control loop for controlling the positive side; and
    using a second control loop for controlling the negative side.

13. The method of claim 12, wherein the first control loop and the second control loop are independent of one another.

14. The method of claim 11, wherein the independently controlling the positive side and the negative side comprises:
    maintaining an output DC voltage of the emitter follower at a constant value.

15. The method of claim 14, wherein the constant value is substantially the same as the reference voltage.

16. The method of claim 14, wherein the retaining the constant value is over one or more of a temperature, a gain control setting, and a process variation.

17. A circuit for mitigating positive side-negative side mismatches in a differential amplifier, comprising:
    a positive side transistor operatively connected to an input of a first control loop;

a negative side transistor operatively connected to an input of a second control loop;

an output of the first control loop that is operatively connected to an input node of the positive side;

an output of the second control loop that is operatively connected to an input node of the negative side;

a first resistor connected between an input voltage source and the positive side transistor; and a second resistor connected between the input voltage source and the negative side transistor.

18. The circuit of claim 17, wherein the first resistor is configured for control of an input voltage at the positive side and the second resistor is configured for control of the input voltage at the negative side.

19. The circuit of claim 17, wherein a first operation of the first control loop operates independent of a second operation of the second control loop.

* * * * *